(12) United States Patent
Bryan et al.

(10) Patent No.: US 6,169,421 B1
(45) Date of Patent: Jan. 2, 2001

(54) COMPLEMENTARY METAL-OXIDE SEMICONDUCTOR BUFFER

(75) Inventors: Thomas Clark Bryan, Encinitas; Harry Huy Dang, San Diego, both of CA (US)

(73) Assignee: Applied Micro Circuits Corporation, San Diego, CA (US)

( * ) Notice: Under 35 U.S.C. 154(b), the term of this patent shall be extended for 0 days.

(21) Appl. No.: 09/303,726

(22) Filed: May 3, 1999

(51) Int. Cl.[7] .............................................. H03K 19/0948
(52) U.S. Cl. ................................... 326/83; 326/87
(58) Field of Search ................................... 326/85, 87, 83, 326/86, 21, 62; 327/108; 365/230.08

(56) References Cited

U.S. PATENT DOCUMENTS

| | | | |
|---|---|---|---|
| 5,124,578 | * 6/1992 | Worley et al. | 307/443 |
| 5,381,059 | * 1/1995 | Douglas | 326/58 |
| 5,557,223 | * 9/1996 | Kuo | 327/108 |
| 6,014,039 | * 1/2000 | Kothandaraman et al. | 326/83 |
| 6,051,995 | * 4/2000 | Pollacheck | 326/87 |

* cited by examiner

*Primary Examiner*—David Nelms
*Assistant Examiner*—Thong Le
(74) *Attorney, Agent, or Firm*—Gray Cary Ware Freidenrich

(57) ABSTRACT

A CMOS buffer for interfacing TTL-standard signals and capable of driving a high capacitance load such as a transmission line with low switching noise and low power consumption. The CMOS buffer includes two CMOS branch circuits that control the operation of a CMOS output device. Each branch circuit includes a first delay and a second delay greater than the first delay. The CMOS output device includes a complementary pair of MOS transistors. The first MOS transistor of the CMOS output device is operated by the first branch circuit in response to a signal that is delayed by the first or the second delay. The second MOS transistor of the CMOS output device is operated by the second branch circuit in response to delay of the signal by the second or the first delay.

17 Claims, 2 Drawing Sheets

COMPLEMENTARY METAL-OXIDE SEMICONDUCTOR BUFFER

BACKGROUND OF THE INVENTION

Complementary metal-oxide semiconductor (CMOS) devices are used extensively in digital and analog circuit applications. These devices combine n-channel and p-channel MOS transistors. Typically the p-channel MOS transistor is connected as a load to the drain of the n-channel MOS transistor. CMOS circuits are favored because of their minimal power consumption and high speed. CMOS fabrication technology supports the manufacture of CMOS circuits and their integration on a single chip with other circuits.

It is frequently desirable to have CMOS circuits operate at TTL logic levels. As is known, TTL logic levels underpin widely-accepted standards of digital circuit operation. TTL logic levels implicate a "low" level having a voltage value equal to or less than 0.5 VDC and "high" level of greater than or equal to 2.4 VDC.

Increasingly, CMOS circuitry is used in telecommunications applications. For example, CMOS buffers are employed to drive highly reactive loads such as transmission lines that conduct compressed voice and data signals. In such applications a significant design goal is to provide an output signal that meets the TTL standard in driving a highly reactive load with minimal noise and low power consumption.

SUMMARY OF THE INVENTION

The invention is a complementary metal-oxide semiconductor (CMOS) buffer that accommodates the differences in operational characteristics between a driving circuit and a driven circuit that is highly reactive.

The invention is a CMOS buffer that transfers a TTL-compatible signal between a first circuit and a highly reactive second circuit while isolating the first from the second circuit.

Preferably, the CMOS buffer is a CMOS circuit in an integrated circuit (IC) device.

The CMOS buffer of this invention includes an input inverter having an input and an output. The output of the CMOS inverter is connected to two electrically-parallel CMOS branch circuits. Each branch circuit exhibits a variable delay to signals output by the CMOS inverter: a first delay and a second delay that is longer than the first delay. The branch circuits are connected to a CMOS device comprising an n-channel MOS transistor and a p-channel MOS transistor. A first branch circuit has a connection to the p-channel MOS transistor and the second branch circuit has a connection to the n-channel MOS transistor. The CMOS device has an output. Preferably, the output is connected to an IC pad for driving a transmission line and includes an impedance-matching resistor.

This CMOS buffer embodies the capability of driving a reactive load from an IC location. The CMOS buffer provides an output signal for driving the reactive load, which can be pulled as high as the level of a supply voltage and as low a ground level. The CMOS buffer embodies the capability of driving a transmission line with TTL-compatible signals with low switching noise and low power consumption.

DETAILED DESCRIPTION OF THE PREFERRED EMBODIMENT

Figure 1:
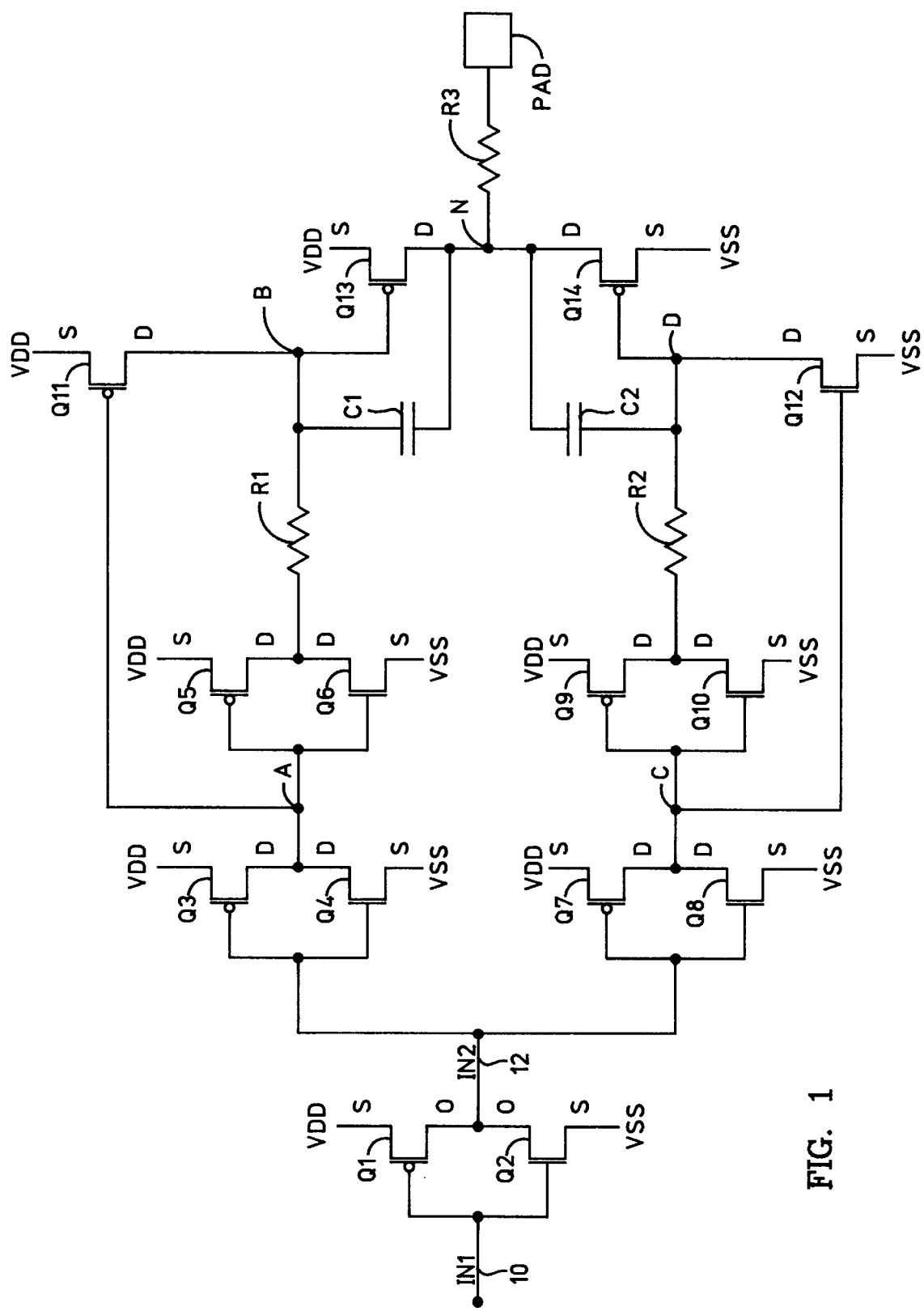
FIG. 1 is a schematic diagram illustrating the CMOS buffer of the invention.

Refer now to FIG. 1 which is a schematic CMOS circuit diagram of the CMOS buffer that is the subject of this invention. The circuit has active components which may be manufactured according to known CMOS technology methods in a monolithic integrated structure such as an integrated circuit (IC). As is typical with CMOS technology, the active elements in the buffer include p-channel and n-channel MOS transistors, each having a source (S), a drain (D) and a gate. Each transistor is indicated by a typical convention Qx, in which Q denotes an MOS transistor and x denotes MOS transistor number x. Schematically, a p-channel CMOS transistor is distinguished from an n-channel CMOS transistor by a small circle at its gate. See transistor Q1 in this regard. As is conventional with CMOS technology, the sources of the p-channel transistors are connected to receive a drain voltage source (VDD), while the sources of the n-channel transistors are connected to a source voltage source (VSS). Direct connection between the voltage sources and the transistors is shown in FIG. 1 for illustration only. As the skilled practitioner will appreciate, such voltage connections are typically by way of voltage rails, for example, in CMOS technology. Typically VDD has a value of 3.3 volts DC (VDC), while VSS is at ground potential, that is substantially at 0 VDC.

The buffer of FIG. 1 has an input signal connection 10 for receiving an input signal IN1 that is provided to the gates of a pair of CMOS transistors Q1 and Q2 that are connected in a typical complementary fashion. In this regard, the p-channel transistor Q1 has its gate connected in common with the gate of the n-channel transistor Q2 to the input 10. The source of the transistor Q1 is connected to VDD, while the source of transistor Q2 is connected to VSS. The drains of the transistors Q1 and Q2 are connected together. Together, the transistors Q1 and Q2 form a CMOS inverter. In this regard, the input signal IN1 present on the input connection 10 will be inverted by the CMOS inverter Q1 Q2. The inverted signal is provided from the common drain connection of the transistors Q1 and Q2 (the output of the CMOS inverter) to an input connection 12 as an inverted signal IN2. The input connection 12 is connected to the input of each of two branch circuits. The first branch circuit comprises CMOS transistors Q3, Q4, Q5, Q6 and Q11, resistor R1, and capacitor C1. The second branch circuit includes CMOS transistors Q7, Q8, Q9, Q10, and Q12, resistor R2, and capacitor C2. In the first branch circuit, the transistors Q3 and Q4 are connected in the same manner as the transistors Q1 and Q2; the transistors Q3 and Q4 therefore form a first CMOS inverter, while the transistors Q5 and Q6 are connected to form a second CMOS inverter. The output 12 is connected to the input of the first CMOS inverter Q3 Q4, while the output of the first CMOS inverter Q3 Q4 is connected to the input of the second CMOS inverter Q5 Q6. The output of the second CMOS inverter Q5 Q6 is connected to one terminal of the resistor R1. The second terminal of the resistor R1 is connected to a first terminal of the capacitor C1. The p-channel CMOS transistor Q11 has a gate connected to the output of the first CMOS inverter Q3 Q4. The source of the transistor Q11 is connected to VDD, while its drain is connected in common with the second terminal of the resistor R1 and the first terminal of the capacitor C1. In the first branch circuit, a node A is defined by the common connection of the output of the first CMOS inverter Q3 Q4, the input of the second CMOS inverter Q5 Q6 and the gate of the transistor Q11. A second node B is defined at the common connection of the second terminal of the resistor R1 the first terminal of the capacitor C1 and the drain of the transistor Q11.

The second branch circuit has a third CMOS inverter comprising CMOS transistors Q7 and Q8 and a fourth CMOS inverter comprising CMOS transistors Q9 and Q10. The input of the third CMOS inverter Q7 Q8 is connected in common with the input of the first CMOS inverter Q3 Q4 and the out connection 12. The output of the third CMOS inverter Q7 Q8 is connected to the input of the fourth CMOS inverter Q9 Q10 and to the gate of the n-channel CMOS transistor Q12. The common connection of the output of the third CMOS inverter Q7 Q8, the input of the fourth CMOS inverter Q9 Q10, and the gate of the n-channel CMOS transistor Q12 form a node C. The output of the fourth CMOS inverter Q9 Q10 is connected to the first terminal of the resistor R2. The second terminal of the resistor R2 is connected to the first terminal of the capacitor C2. The transistor Q12 has a source connected to the voltage source VSS and a drain connected in common with the second terminal of the resistor R2 and the first terminal of the capacitor C2 at a node D.

A CMOS output device is connected to the first branch circuit and the second branch circuit and to an output node N. The output node N is connected to an IC pad (PAD) through a resistor R3. The CMOS output device includes a p-channel CMOS transistor Q13 and an n-channel CMOS transistor Q14. The source of the transistor Q13 is connected to the voltage source VDD. The source of the transistor Q14 is connected to the voltage source VSS. The drains of the transistors Q13 and Q14 are connected together and to the output node N. The CMOS output device Q13 Q14 is connected to the first branch circuit and to the second branch circuit. The connection between the first branch circuit and the CMOS output device is between the gate of the transistor Q13 and node B and between the second terminal of the capacitor C1 and the output node N. The connection between the second branch circuit and the CMOS output device is between the gate of the transistor Q14 and node D and between the second terminal of the capacitor C2 and the output node N.

Still referring to FIG. 1, the CMOS buffer operates as follows. An input binary signal IN1 conforming to the well-known TTL standard is input to the buffer on input IN1. The input is inverted by the inverter Q1 Q2, producing the output signal IN2. The output signal IN2 is provided to each of the two branch circuits. In the first branch circuit, the output signal IN2 (now the input to the branch circuit) is inverted once by the first inverter Q3 Q4 and provided from node A to gate of the transistor Q11. The once-inverted input signal is provided also to the input of the second inverter Q5 Q6, inverted once again, and provided to an RC circuit comprising the resistor R1 and capacitor C1. In the second branch circuit, the output IN2 (now the input to the second branch circuit) is inverted first in third CMOS inverter Q7 Q8 and provided from node C to the gate of the transistor Q12 and to the input of the fourth CMOS inverter Q9 Q10. The signal is inverted once again by the fourth CMOS inverter Q9 Q10 and provided to the RC circuit including the resistor R2 and the capacitor C2.

Assume that the input signal IN1 is initially at the high level. In this case transistor Q11 is off, transistor Q13 is on, transistor Q12 is on, and transistor Q14 is off. The output node N is at VDD, equivalent to the high level of the standard TTL signal.

When the signal on IN1 transitions to the low state (for the TTL standard, equal to or less than 0.8 VDC), the signal level at node A is low and the transistor Q11 is turned on. This pulls node B up quickly to VDD, thereby quickly switching off the transistor Q13 in the CMOS output device. In the second branch circuit, the signal level at node C transitions to the low state, sending the output of the fourth CMOS inverter Q9 Q10 high, but delaying the provision of the high signal level at node D while the capacitor C2 charges through the resistor R2. After the delay, node D goes high, turning on the transistor Q14 of the CMOS output device. This transitions the signal level at the output node N to the low level. Therefore, when the input signal IN1 transitions to the low TTL level, in the CMOS output device, the transistor Q13 is switched off after a first delay through the first CMOS inverter Q3 Q4 and the transistor Q11, while the transistor Q14 is switched on after a second delay that is longer than the first delay, the second delay being through the third CMOS inverter Q7 Q8, the fourth CMOS inverter Q9 Q10, and the RC circuit including the resistor R2 and capacitor C2.

Assume now that the input signal IN1 transitions from the low TTL level to the high TTL level following the operation just described. Just prior to the transition, the CMOS output device is in an operational state in which the transistor Q14 is active and the transistor Q13 is turned off. When the input signal IN1 switches from the low TTL level to the high TTL level, the output signal IN2 transitions from high to low. In the first branch circuit, this transition is inverted through the first CMOS inverter Q3 Q4 so that the signal level at node A transitions low-to-high, turning off the transistor Q11. The low to high transition at node A is inverted through the second CMOS inverter Q5 Q6 into a high-to-low transition that is delayed through the RC circuit including resistor R1 and resistor C1. Therefore, the high-to-low transition at the output of the second CMOS inverter Q5 Q6 is delayed at node B, delaying the commencement of operation of the transistor Q13 in the CMOS output device. Concurrently with the operation just described, the second branch circuit inverts the high-to-low transition of IN2 through the third CMOS inverter Q7 Q8, producing a low-to-high transition at node C, which turns on Q12, thereby quickly turning off transistor Q14 of the CMOS output device. In this case, the signal transition that turns off the transistor Q14 in the CMOS output device is delayed by the first delay that is shorter in time than the second delay imposed by the RC delay in the first branch circuit.

The operation of the CMOS output device Q13 Q14 provides at the node N, an output signal that meets the TTL standard, varying between 0.0 VDC (VSS) and 3.3 VDC (VDD). In the operational description just given, the buffer prevents the transistors Q13 and Q14 from turning on simultaneously, thereby reducing the noise generated and the power consumed by the buffer.

Switching noise in the output CMOS device is reduced or ameliorated by slowing down the transitions of Q13 and Q14 into operation. These slow downs are produced by the (substantially equal) delays through the RC circuits R1 C1 and R2 C2.

Figure 2:
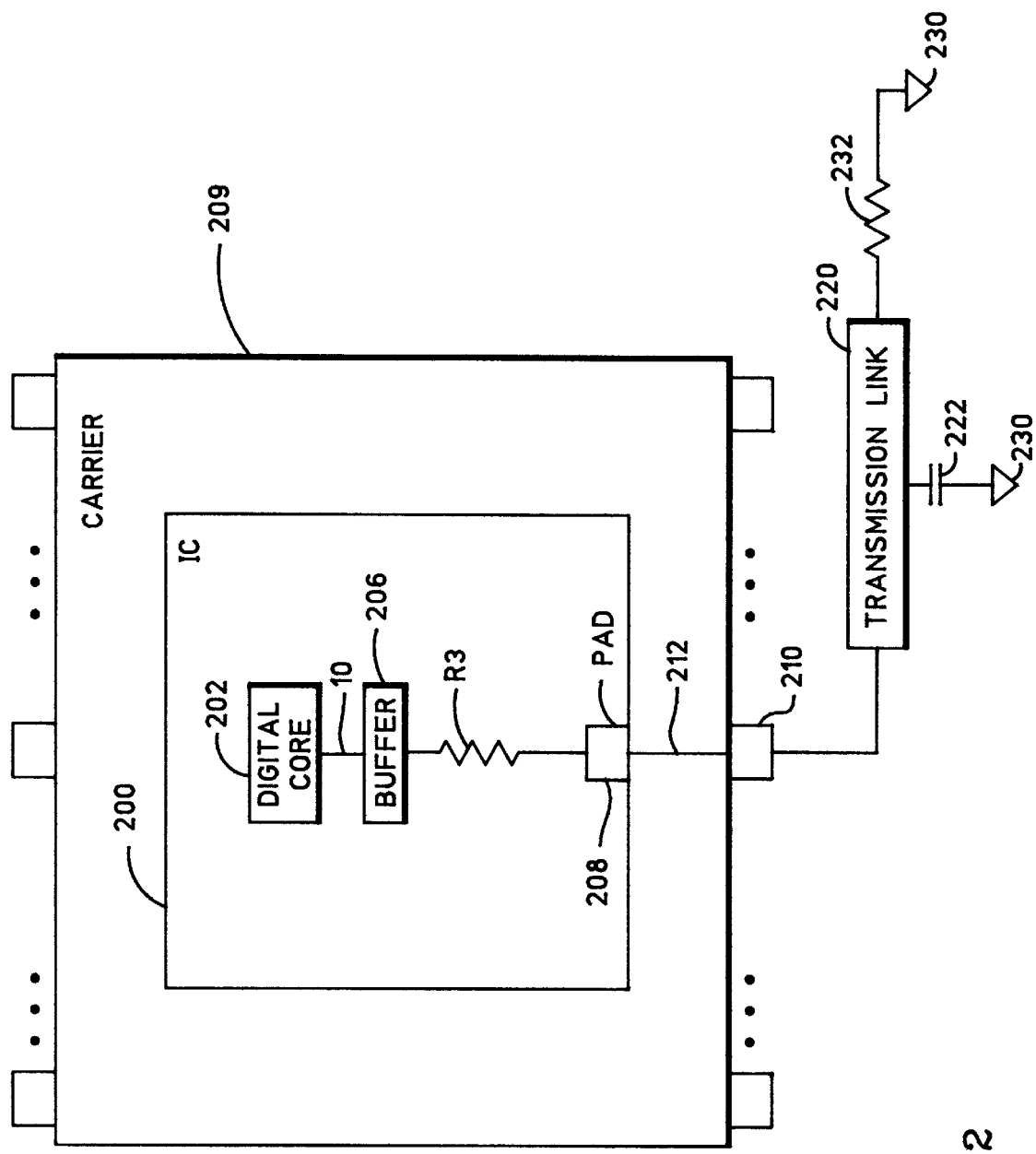
FIG. 2 is hybrid block/schematic diagram illustrating the interconnection between digital core circuitry and a transmission line by the CMOS buffer of this invention.

The resistor R3 is connected between the node N and an IC output pad (PAD). This resistor's role may be understood with reference to FIG. 2. In FIG. 2, an integrated circuit 200 comprises CMOS circuits in a digital core 202. The digital core is interfaced to circuitry off of the integrated circuit 200 through a CMOS buffer 206 which is constructed according to the schematic of FIG. 1. The CMOS buffer 206 is connected (for example at node N in FIG. 1) to one terminal of the resistor R3. The other terminal of the resistor R3 is connected to an IC pad 208. The buffer 206 is meant to represent one or more buffers that are integrated into the IC 200 for interfacing circuits into and out of the digital core 202. FIG. 2 is not intended to limit the invention to an IC having only a single buffer.

Assume that the IC 200 is designed to provide functionality for a telecommunications system by outputting TTL-level signals through 206, R3, 208 for conduction in a transmission line 220. Conventionally, the IC 200 will be mounted in an IC carrier 209 having one or more pins such as the pin 210. The pins are meant to provide connection points for signal access to and from the IC 200. A typical IC fabrication procedure connects the pins with pads in the IC 200 by conductive pathways, which are thin strips of conductive metal. One such pathway 212 connects the pad 208 with the pin 210. The pin 210 therefore provides an output from the IC 200 that is buffered by the CMOS buffer 206. The transmission line 220 connected to the pin 210 represents a reactive load having a significant capacitive component, represented by the capacitor 222 connected between the transmission line 220 and ground 230. Typically, the transmission line 220 connects the pin 210 to a load, represented by a resistor 232. The resistor R3 in the IC 200 is in the output of the CMOS buffer 206 in order to match the impedance represented by the resistance 232, thereby reducing degradation of signals output by the IC through the pad 208 caused by reflection.

EXAMPLE

The circuit of FIG. 1 has been designed to make the first delays in the first and second CMOS branch circuits substantially equal, and to make the second delays in the first and second branch circuits substantially equal, but longer than the first delays. For a CMOS buffer according to the invention designed to operate at a digital signal rate of 125 Mbits per second, the following component values were used.

| COMPONENT | VALUE | UNITS |
|---|---|---|
| R1, R2 | 1700 | ohms |
| R3 | 35 | ohms |
| C1, C2 | 200 | ffarads |
| Q1, Q2, Q3, Q4, Q5 Q6, A7, Q8, Q9, Q10 | 2/0.35* | microns/microns |
| Q11, Q12 | 5/0.35* | microns/microns |
| Q13 | 10/0.35* | microns/microns |
| Q14 | 10/0.45* | microns/microns |

*Denotes channel width (W)/channel length (L)

Clearly, the other embodiments and modifications of this invention will occur readily to those of ordinary skill in the art in view of these teachings. Therefore, this invention is to be limited only by following claims, which include all such embodiments and modifications when viewed in conjunction with the above specification and accompanying drawings.

We claim:

1. A CMOS (complementary metal oxide semiconductor) buffer for connection to a first voltage source and a second voltage source and including an input connection and an output node, comprising:

a CMOS inverter with an input connected to the input connection and an output;

a first CMOS branch circuit connected to the output for delaying a signal by a first amount of time or a second amount of time;

a second CMOS branch circuit connected to the output for delaying the signal by the second amount of time when the first CMOS branch circuit delays the signal by the first amount of time and for delaying the signal by the first amount time when the first CMOS branch circuit delays the signal for the second amount of time; and a CMOS output device including a first MOS transistor connected to the first CMOS branch circuit and to the output node and a second MOS transistor connected to the second CMOS branch circuit and to the output node.

2. The CMOS buffer of claim 1 further including a resistor connected to the output node.

3. The CMOS buffer of claim 2, in combination with an integrated circuit (IC) pad, the resistor connected between the output node and the IC pad.

4. The CMOS buffer of claim 1, the first CMOS branch circuit including:

a first CMOS inverter having an input connected to the output of the CMOS inverter and an output;

a second CMOS inverter having an input connected to the output of the first CMOS inverter and an output;

a first resistor with a first terminal connected to the output of the second CMOS inverter and a second terminal;

a first capacitor with a first terminal connected to the second terminal of the first resistor and a second terminal connected to the output node; and a first MOS transistor having a gate connected to the output of the first CMOS inverter and a drain connected to the second terminal of the first resistor wherein, the first MOS transistor of the CMOS output device has a gate connected to the second terminal of the first resistor and a drain connected to the output node.

5. The CMOS buffer of claim 4, the second CMOS branch circuit including:

a third CMOS inverter having an input connected to the output of the CMOS inverter and an output;

a fourth CMOS inverter having an input connected to the output of the third CMOS inverter and an output;

a second resistor with a first terminal connected to the output of the fourth CMOS inverter and a second terminal;

a second capacitor with a first terminal connected to the second terminal of the second resistor and a second terminal connected to the output node; and, a second MOS transistor having a gate connected to the output of the third CMOS inverter and a drain connected to the second terminal of the second resistor;

wherein the second MOS transistor of the CMOS output device has a gate connected to the second terminal of the second resistor and a drain connected to the output node.

6. The CMOS buffer of claim 5 further including a third resistor connected to the output node.

7. The CMOS buffer of claim 6, in combination with an integrated circuit (IC) pad, the third resistor connected between the output node and the IC pad.

8. The CMOS buffer of claim 5, wherein the first delay in the first CMOS branch circuit is through the first MOS Transistor in the first CMOS branch circuit and the first delay in the second branch circuit is through the second MOS transistor in the second branch circuit.

9. The CMOS buffer of claim 8, wherein the second delay in the first branch circuit is through the first resistor and the first capacitor and the second delay in the second CMOS branch circuit is through the second resistor and the second capacitor.

10. An integrated circuit (IC), comprising:
   core circuits with a plurality of outputs; and
   at least one CMOS (complementary metal oxide semiconductor) buffer that includes:
   a CMOS inverter with an input connected to the input connection and an output;
   a first CMOS branch circuit connected to the output for delaying a signal by a first amount of time or a second amount of time;
   a second CMOS branch circuit connected to the output for delaying the signal by the second amount of time when the first CMOS branch circuit delays the signal by the first amount of time and for delaying the signal by the first amount time when the first CMOS branch circuit delays the signal for the second amount of time; and
   a CMOS output device including a first MOS transistor connected to the first CMOS branch circuit and to the output node and a second MOS transistor connected to the second CMOS branch circuit and to the output node.

11. The IC of claim 10, wherein the at least one CMOS buffer includes a resistor connected to the output node.

12. The IC of claim 11, wherein the IC includes a plurality of pads, the resistor connected between one pad and the output node.

13. The IC of claim 10, wherein the first CMOS branch circuit includes:
   a first CMOS inverter having an input connected to the output of the CMOS inverter and an output;
   a second CMOS inverter having an input connected to the output of the first CMOS inverter and an output;
   a first resistor with a first terminal connected to the output of the second CMOS inverter and a second terminal;
   a first capacitor with a first terminal connected to the second terminal of the first resistor and a second terminal connected to the output node; and
   a first MOS transistor having a gate connected to the output of the first CMOS inverter and a drain connected to the second terminal of the first resistor
   wherein, the first MOS transistor of the CMOS output device has a gate connected to the second terminal of the first resistor and a drain connected to the output node.

14. The IC of claim 13, wherein the second CMOS branch circuit includes:
   a third CMOS inverter having an input connected to the output of the CMOS inverter and an output;
   a fourth CMOS inverter having an input connected to the output of the third CMOS inverter and an output;
   a second resistor with a first terminal connected to the output of the fourth CMOS inverter and a second terminal;
   a second capacitor with a first terminal connected to the second terminal of the second resistor and a second terminal connected to the output node; and,
   a second MOS transistor having a gate connected to the output of the third CMOS inverter and a drain connected to the second terminal of the second resistor;
   wherein the second MOS transistor of the CMOS output device has a gate connected to the second terminal of the second resistor and a drain connected to the output node.

15. The IC of claim 14, wherein the IC includes a plurality of pads, the third resistor connected between one pad and the output node.

16. The IC of claim 14, wherein the first delay in the first CMOS branch circuit is through the first MOS transistor in the first CMOS branch circuit and the first delay in the second branch circuit is through the second MOS transistor in the second branch circuit.

17. The IC of claim 16 wherein the second delay in the first branch circuit is through the first resistor and the first capacitor and the second delay in the second CMOS branch circuit is through the second resistor and the second capacitor.

* * * * *

UNITED STATES PATENT AND TRADEMARK OFFICE
CERTIFICATE OF CORRECTION

PATENT NO. : 6,169,421 B1
DATED : January 2, 2001
INVENTOR(S) : Bryan et al.

Page 1 of 1

It is certified that error appears in the above-identified patent and that said Letters Patent is hereby corrected as shown below:

Title page,
"References Cited", please add the following:
-- 4,642,488  2/1987  Parker
   4,656,374  4/1987  Rapp
   5,304,872  4/1994  Avraham et al --

Signed and Sealed this

Twenty-seventh Day of November, 20001

Attest:

Nicholas P. Godici

Attesting Officer

NICHOLAS P. GODICI
Acting Director of the United States Patent and Trademark Office